United States Patent
Liu et al.

(10) Patent No.: US 9,903,018 B2
(45) Date of Patent: Feb. 27, 2018

(54) COATED BODY WHEREIN THE COATING SCHEME INCLUDES A COATING LAYER OF $TIAL_2O_3$ AND METHOD OF MAKING THE SAME

(71) Applicant: Kennametal Inc., Latrobe, PA (US)

(72) Inventors: Zhenyu Liu, Greensburg, PA (US); Rodrigo A. Cooper, Latrobe Greensburg, PA (US); Peter R. Leicht, Latrobe, PA (US); Mark S. Greenfield, Greensburg Summerville, SC (US); Yixiong Liu, Greensburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 230 days.

(21) Appl. No.: 15/072,760

(22) Filed: Mar. 17, 2016

(65) Prior Publication Data

US 2016/0194754 A1 Jul. 7, 2016

Related U.S. Application Data

(62) Division of application No. 14/207,828, filed on Mar. 13, 2014, now Pat. No. 9,371,580.

(Continued)

(51) Int. Cl.
*C23C 16/40* (2006.01)
*C23C 16/455* (2006.01)
*C23C 28/04* (2006.01)

(52) U.S. Cl.
CPC ............ *C23C 16/40* (2013.01); *C23C 16/403* (2013.01); *C23C 16/45523* (2013.01);
(Continued)

(58) Field of Classification Search
CPC ...... C23C 16/40; C23C 16/403; C23C 16/405
See application file for complete search history.

(56) References Cited

U.S. PATENT DOCUMENTS

| 672,698 A | 4/1901 | Braddock |
| 4,052,530 A | 10/1977 | Frank |

(Continued)

FOREIGN PATENT DOCUMENTS

| CN | 85104135 A | 11/1986 |
| CN | 1524653 A | 9/2004 |

(Continued)

OTHER PUBLICATIONS

Kim, Hyungsub, et al., "Fabrication of Ti/Al2O3 gradient coating layer using electrophoretic deposition for implant abutment application". Abstract #2311, 224th ECS Meeting, 2013 The Electrochemical Society, 1 page.*

(Continued)

*Primary Examiner* — Bret P Chen
(74) *Attorney, Agent, or Firm* — Larry R. Meenan

(57) ABSTRACT

A coated cutting insert and a method for making the same. The coated cutting insert has a substrate with a substrate surface. There is a backing coating scheme on the substrate surface, and a $TiAl_2O_3$ coating layer wherein the $TiAl_2O_3$ coating layer is deposited using chemical vapor deposition from a gaseous composition including $AiCl_3$, $H_2$, $TiCl_4$, $CO_2$ and HCl.

10 Claims, 11 Drawing Sheets

EXAMPLE R1

Related U.S. Application Data

(60) Provisional application No. 61/804,007, filed on Mar. 21, 2013.

(52) U.S. Cl.
CPC .......... *C23C 28/042* (2013.01); *C23C 28/044* (2013.01); *C23C 28/048* (2013.01); *Y10T 428/265* (2015.01)

(56) References Cited

U.S. PATENT DOCUMENTS

| | | |
|---|---|---|
| 4,112,148 A | 9/1978 | Fonzi |
| 4,180,400 A | 12/1979 | Smith et al. |
| 4,576,836 A | 3/1986 | Colmet et al. |
| 4,701,384 A | 10/1987 | Sarin et al. |
| 4,702,970 A | 10/1987 | Sarin et al. |
| 4,745,010 A | 5/1988 | Sarin et al. |
| 4,746,563 A | 5/1988 | Nakano et al. |
| 4,749,629 A | 6/1988 | Sarin et al. |
| 4,751,109 A | 6/1988 | Sarin et al. |
| 4,844,951 A | 7/1989 | Sarin et al. |
| 5,310,607 A | 5/1994 | Schulz et al. |
| 5,447,804 A | 9/1995 | Schulz et al. |
| 5,709,907 A | 1/1998 | Battaglia et al. |
| 5,722,803 A | 3/1998 | Battaglia et al. |
| 5,770,261 A | 6/1998 | Nakamura et al. |
| 5,827,570 A | 10/1998 | Russell |
| 5,871,850 A | 2/1999 | Moriguchi et al. |
| 5,879,823 A | 3/1999 | Prizzi et al. |
| 5,972,495 A | 10/1999 | Ishi et al. |
| 5,985,427 A | 11/1999 | Ueda et al. |
| 6,156,383 A | 12/2000 | Ishi et al. |
| 6,161,990 A | 12/2000 | Oles et al. |
| 6,183,846 B1 | 2/2001 | Moriguchi et al. |
| 6,333,103 B1 | 12/2001 | Ishi et al. |
| 6,426,137 B1 | 7/2002 | Oshika et al. |
| 6,436,519 B2 | 8/2002 | Holzschuh |
| 6,599,062 B1 | 7/2003 | Oles, Jr. et al. |
| 6,641,939 B1 | 11/2003 | Lee et al. |
| 6,660,371 B1 | 12/2003 | Westphal et al. |
| 6,689,422 B1 | 2/2004 | Warnes et al. |
| 6,713,172 B2 | 3/2004 | Ljungberg et al. |
| 6,726,987 B2 | 4/2004 | Kathrein et al. |
| 6,756,111 B1 | 6/2004 | Okada et al. |
| 6,849,132 B2 | 2/2005 | Warnes et al. |
| 6,869,668 B2 | 3/2005 | Martensson |
| 6,902,764 B2 | 6/2005 | Ljungberg et al. |
| 7,011,867 B2 | 3/2006 | Matensson |
| 7,090,914 B2 | 8/2006 | Yamagata et al. |
| 7,094,445 B2 | 8/2006 | Ruppi |
| 7,094,447 B2 | 8/2006 | Ruppi |
| 7,163,735 B2 | 1/2007 | Ruppi |
| 7,241,492 B2 | 7/2007 | Kohara et al. |
| 7,273,665 B2 | 9/2007 | Hayahi et al. |
| 7,276,301 B2 | 10/2007 | Tsushima et al. |
| 7,326,461 B2 | 2/2008 | Sottke et al. |
| 7,378,158 B2 | 5/2008 | Richter et al. |
| 7,410,707 B2 | 6/2008 | Fukui et al. |
| 7,396,581 B2 | 7/2008 | Ruppi |
| 7,416,778 B2 | 8/2008 | Westergren et al. |
| 7,442,433 B2 | 10/2008 | Honma et al. |
| 7,498,089 B2 | 3/2009 | Omori et al. |
| 7,531,212 B2 | 5/2009 | Kohara et al. |
| 7,531,213 B2 | 5/2009 | Bjormander |
| 7,597,511 B2 | 10/2009 | Tomita et al. |
| 7,597,951 B2 | 10/2009 | Bjormander et al. |
| 7,597,970 B2 | 10/2009 | Fukano et al. |
| 7,691,496 B2 | 4/2010 | Park et al. |
| 7,803,464 B2 | 9/2010 | Okada et al. |
| 7,820,310 B2 | 10/2010 | Bjormander |
| 7,901,788 B2 | 3/2011 | Warnes et al. |
| 7,906,230 B2 | 3/2011 | Watanae et al. |
| 7,923,101 B2 | 4/2011 | Ruppi |
| 7,928,026 B2 | 4/2011 | Nawa et al. |
| 7,939,181 B2 | 5/2011 | Ramm et al. |
| 7,967,533 B2 | 6/2011 | Omori et al. |
| 7,968,182 B2 | 6/2011 | Trinh et al. |
| 7,972,714 B2 | 7/2011 | Okada et al. |
| 8,012,611 B2 | 9/2011 | Okada et al. |
| 8,025,991 B2 | 9/2011 | Schier |
| 8,071,211 B2 | 12/2011 | Koike et al. |
| 8,080,312 B2 | 12/2011 | McNerny et al. |
| 8,097,332 B2 | 1/2012 | Omori et al. |
| 8,119,226 B2 | 2/2012 | Reineck et al. |
| 8,119,227 B2 | 2/2012 | Reineck et al. |
| 8,129,040 B2 | 3/2012 | Quinto et al. |
| 8,152,971 B2 | 4/2012 | Quinto et al. |
| 8,221,838 B2 | 7/2012 | Gates, Jr. et al. |
| 8,288,019 B2 | 10/2012 | Nagano et al. |
| 2001/0006724 A1 | 7/2001 | Holzschuh |
| 2002/0081447 A1 | 6/2002 | Movchan et al. |
| 2002/0114945 A1 | 8/2002 | Greenberg et al. |
| 2002/0119017 A1 | 8/2002 | Gates, Jr. et al. |
| 2004/0224159 A1 | 11/2004 | Oshika et al. |
| 2004/0241490 A1 | 12/2004 | Finley |
| 2005/0260454 A1 | 11/2005 | Fang et al. |
| 2005/0266045 A1 | 11/2005 | Fang et al. |
| 2005/0276990 A1* | 12/2005 | Kohara .................. C23C 8/02 428/469 |
| 2006/0029813 A1 | 2/2006 | Kutilek et al. |
| 2006/0292390 A1 | 12/2006 | Kassner et al. |
| 2007/0212895 A1 | 9/2007 | Chua et al. |
| 2007/0289280 A1 | 12/2007 | Marquardt |
| 2008/0196318 A1 | 6/2008 | Bost et al. |
| 2010/0166512 A1* | 7/2010 | Tanibuchi .............. C23C 16/34 407/119 |
| 2010/0303566 A1 | 12/2010 | Fang et al. |
| 2012/0003452 A1 | 1/2012 | Tomita et al. |
| 2014/0287199 A1* | 9/2014 | Liu ..................... C23C 16/403 428/195.1 |
| 2014/0287228 A1* | 9/2014 | Liu .................. C23C 16/45523 428/336 |
| 2014/0287229 A1 | 9/2014 | Wendt et al. |
| 2016/0160347 A1* | 6/2016 | Liu ......................... C23C 16/44 428/336 |
| 2016/0208379 A1* | 7/2016 | Satoh .................... C23C 16/403 |

FOREIGN PATENT DOCUMENTS

| | | |
|---|---|---|
| CN | 1836811 A | 9/2006 |
| CN | 101468401 A | 7/2009 |
| CN | 101473063 A | 7/2009 |
| CN | 101622378 A | 1/2010 |
| CN | 101959631 A | 1/2011 |
| CN | 102575334 A | 7/2012 |
| CN | 102581324 | 7/2012 |
| DE | 2736982 | 3/1979 |
| EP | 0275977 B2 | 8/1998 |
| EP | 0786535 B2 | 11/2002 |
| EP | 0 786 536 B1 | 5/2003 |
| EP | 1655387 | 5/2008 |
| EP | 1655387 B1 | 5/2008 |
| EP | 1616979 B1 | 10/2009 |
| EP | 1096037 B1 | 8/2010 |
| JP | 56152962 | 11/1981 |
| JP | 57158372 | 9/1982 |
| JP | 5921586 | 3/1984 |
| JP | 59-085860 | 5/1984 |
| JP | 5985860 | 5/1984 |
| JP | 0516031 | 1/1993 |
| JP | 4812255 | 11/2001 |
| JP | 2003039207 | 2/2003 |
| JP | 2005205516 A | 8/2005 |
| JP | 2006219739 | 8/2006 |
| JP | 2006289556 | 10/2006 |
| JP | 4019244 | 12/2007 |
| JP | 2008019489 | 1/2008 |
| JP | 2008019498 | 1/2008 |
| JP | 4195518 | 12/2008 |
| JP | 4645983 | 3/2011 |
| JP | 2011057529 | 3/2011 |
| JP | 2011127165 | 6/2011 |

(56) References Cited

FOREIGN PATENT DOCUMENTS

| JP | 2011184295 | 9/2011 |
| JP | 4822120 | 11/2011 |
| JP | 2012143825 | 8/2012 |
| JP | 5019255 | 9/2012 |
| JP | 5099490 | 12/2012 |
| JP | 5099500 | 12/2012 |
| KR | 1020060102658 | 9/2006 |
| WO | 02/077312 A2 | 10/2002 |
| WO | 2002077312 | 10/2002 |

OTHER PUBLICATIONS

Moulton, P.F., et al., "Spectroscopic and laser characteristics of Ti:Al2O3". vol. 3, No. 1/Jan. 1986/J. Opt. Soc. Am. B, pp. 125-133.*

Baggetto, Loic, et al., "Amorphous alumina thin films deposited on titanium: Interfacial chemistry and thermal oxidation barrier properties". Phys. Status Solidi A 213, No. 2 470-480 (2016)/ DOI 10.1002/pssa.201532838.*

Taylor, Dissertation entitled "Grain Boundary Structure and Solute Segregation in Titanium-Doped Sapphire Bicrystals", Engineering Materials Science and Mineral Engineering, University of California, berkeley (Spring 2002) 222 pages.

Hochauer et al., "Titanium Doped CVD Alumina Coatings", Surface & Coatings Technology, 203 (2008) pp. 350-356.

Kathrein et al., "Doped CVD Al2O3 Coatings for High Performance Cutting Tools", Surface & Coating Technology 163-164 (2001) pp. 181-188.

Moltrecht, "Machine Shop Practice", Industrial Press Inc., New York, New York (1981) pp. 199-204.

ASTE Tool Engineers Handbook, McGraw Hill Book Co., New York, New York (1949) pp. 302-315.

PCT Patent Application No. PCT/US2014/031358 International Search Report and Written Opinion )Jul. 7, 2014) 8 pages.

PCT Patent Application No. PCT/US2014/031291 Notification of Transmittal, International Search Report and Written Opinion (Jul. 4, 2014) 15 pages.

Yu, Z. et al., "Atomic-Resolution Observation of Hf-Doped Alumina Grain Boundaries," Scripta Materials 68 (2013), pp. 703-706.

Feng X et al., "Converting Ceria Polyhedral Nonoparticles into Single-Crystal Nanospheres," vol. 312 Science (Jun. 2006) pp. 1504-1508.

Li et al., "Nanodomain Formation and Distribution in Gd-Doped Ceria," Materials Research Bulletin 47 (2012) pp. 763-767.

Bjormander, "CVD Deposition and Characterization of Coloured Al2O3/ZrO2 Multilayers," Surface and Coatings Technology 201 (2006) pp. 4032-4036.

Russell, W.C. et al., "Wear Characteristics and Performance of Composite Alumina-Zirconia CVD Coatings", Int. J. Refractory Metals & Hard Materials 14 (1996) pp. 51-58.

Bulban, J.P. "Grain Boundary Strengthening in alumina by Rare Earth Impurities," vol. 311 Science (Jan. 13, 2006) pp. 212-215.

Shibata, N. et al. "Atomic-Scale Imaging of Individual Dopant Atoms in a Buried Interface", Nature Materials vol. 8 (Aug. 2009) pp. 654-657.

U.S. Appl. No. 14/221,138, filed Mar. 20, 2014 Notice of Allowance and Notice of Allowability dated Jul. 31, 2015.

U.S. Appl. No. 14/220,959, filed Mar. 20, 2014 Notice of Allowance and Notice of Allowability dated Aug. 5, 2015.

PCT Patent Application No. PCT/US2014/031291 Notification Concerning Transmittal of International Search Report on Patentability (dated Oct. 1, 2015) 1 page.

PCT Patent Application No. PCT/US2014/031358 Notification Concerning Transmittal of International Search Report on Patentability (dated Oct. 1, 2015) 1 page.

PCT Patent Application No. PCT/US2014/030974 Notification Concerning Transmittal of International Search report on Patentability (dated Oct. 1, 2015) 1 page.

Aug. 4, 2017 Second Office Action.

Sep. 8, 2017 Second Office Action.

Dec. 29, 2016 First office action.

Jan. 17, 2017 First office action.

Jan. 18, 2017 First office action.

PCT/US2014/030974 International Search Report and Written Opinion dated Aug. 18, 2014 (13 pages).

U.S. Appl. No. 14/207,828 Notice of Allowance and Fees Due dated Aug. 25, 2015 (5 pages).

U.S. Appl. No. 14/207,828 Notice of Allowance and Fees Due dated Nov. 9, 2015 (5 pages).

U.S. Appl. No. 14/207,828 Notice of Allowance and Fees Due dated Feb. 22, 2016 (5 pages).

* cited by examiner

EXAMPLE R1

EXAMPLE R2

EXAMPLE R3

EXAMPLE R4

US 9,903,018 B2

COATED BODY WHEREIN THE COATING SCHEME INCLUDES A COATING LAYER OF TIAL$_2$O$_3$ AND METHOD OF MAKING THE SAME

CROSS REFERENCE TO EARLIER APPLICATION

This patent application is a divisional patent application which claims the benefit under the United States Patent Laws (35 USC 120) of U.S. patent application Ser. No. 14/207,828, filed Mar. 13, 2014, now U.S. Pat. No. 9,371,580, to Zhenyu Liu et al. for COATED BODY WHEREIN THE COATING SCHEME INCLUDES A COATING LAYER of TiAl$_2$O$_3$ AND METHOD OF MAKING THE SAME, which claims the benefit under the United States Patent Statute (Title 35 United States Code) including Section 119(e) of provisional U.S. patent application Ser. No. 61/804,007 filed Mar. 21, 2013 to Zhenyu Liu et al. for COATED BODY WHEREIN THE COATING SCHEME INCLUDES A COATING LAYER of TiAl$_2$O$_3$ AND METHOD OF MAKING THE SAME. Applicants hereby incorporate by reference herein the entirety of such provisional U.S. patent application Ser. No. 61/804,007 filed Mar. 21, 2013 to Zhenyu Liu et al. and applicants hereby incorporate by reference herein the entirety of such pending U.S. patent application Ser. No. 14/207,828 filed Mar. 13, 2014.

BACKGROUND OF THE INVENTION

The present invention pertains to a coated body (and method of making the same) wherein the coating scheme is applied by chemical vapor deposition (CVD), and especially coated cutting inserts that are useful in material removal applications such as, for example, machining, turning, and milling. More specifically, the present invention pertains to a coated body (and method of making the same), such as, for example, a coated cutting insert wherein the coating scheme includes a TiAl$_2$O$_3$ coating layer applied by CVD, and wherein the coated cutting insert exhibits acceptable properties including suitability in high performance cutting applications, high speed cutting applications, improved thermal resistance, and improved wear resistance.

Heretofore, coated bodies, such as, for example, coated cutting inserts, have been used in material removal applications. The coating layers typically comprise hard refractory materials that exhibit the properties of thermal resistance and/or wear resistance. One primary purpose of using a coating on a cutting insert has been to lengthen the useful life of the cutting insert. Exemplary such ones of these coating schemes are described in some of the following documents: article entitled "Titanium doped CVD alumina coatings", *Surface & Coatings Technology* 203 (2008), pages 350-356 by Hochaer et al., article entitled "Doped CVD Al2O3 coatings for high performance cutting tools", *Surface & Coatings Technology* 163-164 (2001), pages 181-188 by Kathrein et al., U.S. Pat. No. 4,180,400 to Smith et al., Japanese Published Patent Application No. 59-085860A to a PARTS OF CUTTING TOOL, U.S. Pat. No. 4,746,563 to Nakano, U.S. Pat. No. 6,660,371 to Westphal et al., and U.S. Pat. No. 7,326,461 to Sottke et al.

As is apparent from the above documents, many different coating schemes for a coated cutting insert have been used in the past. According to these documents, each one of these coating schemes provides certain advantages. Even though there have been coating schemes that are supposed to provide certain advantages, there has always remained a desire to continue to lengthen the useful life, as well as to improve the high performance cutting applications properties, high speed cutting applications properties, improved thermal resistance properties, and improved wear resistance properties of the coated cutting inserts. The desire to lengthen the useful life, as well as to improve the high performance cutting applications properties, high speed cutting applications properties, improved thermal resistance properties, and improved wear resistance properties is extant for coated cutting inserts.

Thus, it would be highly desirable to provide a coated cutting insert (and method of making the same, which is useful in material removal applications, with improved properties wherein the CVD coating comprises a coating scheme that includes a coating layer of TiAl$_2$O$_3$. Further, it would be highly desirable to provide a coated cutting insert (and method of making the same), which is useful in material removal applications, wherein the CVD coating comprises a coating scheme that includes a coating layer of TiAl$_2$O$_3$ and the cutting insert has a lengthened tool life, as well as exhibits improved performance characteristics. Still further, it would be highly desirable to provide a coated cutting insert (and method of making the same), which is useful in material removal applications, wherein the CVD coating comprises a coating scheme that includes a coating layer of TiAl$_2$O$_3$ and the cutting insert has a lengthened tool life, as well as exhibits acceptable properties including suitability in high performance cutting applications, high speed cutting applications, improved thermal resistance, and improved wear resistance.

SUMMARY OF THE INVENTION

In one form the invention is a coated cutting insert comprising a substrate having a substrate surface, a backing coating scheme on the substrate surface, and a TiAl$_2$O$_3$ coating layer wherein the TiAl$_2$O$_3$ coating layer is deposited using chemical vapor deposition from a gaseous composition including AlCl$_3$, H$_2$, TiCl$_4$, CO$_2$ and HCl.

In another form thereof, the invention is a method for making a coated cutting insert comprising the steps of: providing a substrate having a substrate surface; depositing by chemical vapor deposition a backing coating scheme on the substrate surface; and depositing by chemical vapor deposition a TiAl$_2$O$_3$ coating layer from a gaseous composition including AlCl$_3$, H$_2$, TiCl$_4$, CO$_2$ and HCl.

In still another form, the invention is a method for making a coated cutting insert comprising the steps of: providing a substrate having a substrate surface; depositing by chemical vapor deposition a backing coating scheme on the substrate surface; and depositing by chemical vapor deposition a TiAl$_2$O$_3$-aluminum oxide coating scheme comprising alternating coating layers of a TiAl$_2$O$_3$ coating layer deposited using chemical vapor deposition from a gaseous composition including AlCl$_3$, H$_2$, TiCl$_4$, CO$_2$ and HCl and an aluminum oxide coating layer.

BRIEF DESCRIPTION OF THE DRAWINGS

The following is a brief description of the drawings that form a part of this patent application.

DETAILED DESCRIPTION

Figure 1:
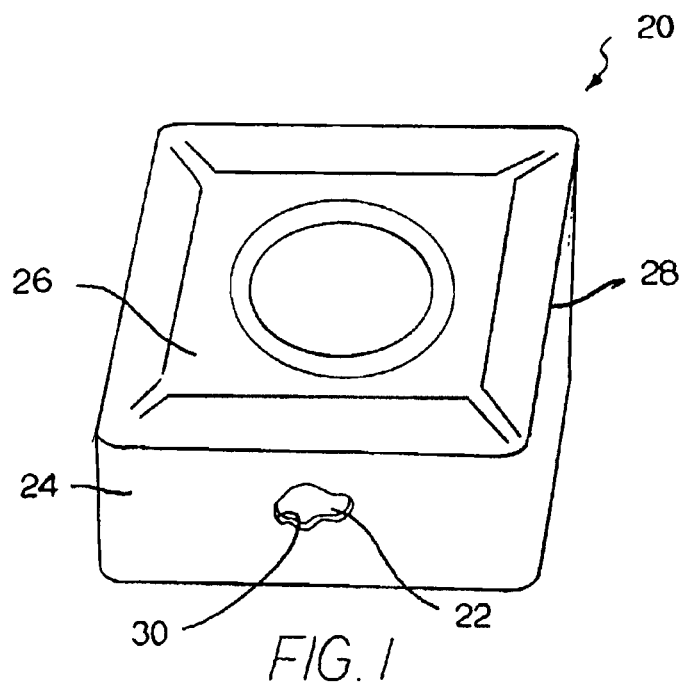
FIG. 1 is an isometric view of a specific embodiment of a coated cutting insert of the invention with a portion of the coating scheme removed to expose the substrate.

FIG. 1 illustrates an embodiment of a coated cutting insert (which is one form of a coated body) that is generally designated as 20, and which is typically useful in conjunction with a cutting assembly for a chipforming material removal operation. In a chipforming material removal operation, the cutting insert engages a workpiece to remove material from a workpiece typically in the form of chips. A material removal operation that removes material from the workpiece in the form of chips typically is known by those skilled in the art as a chipforming material removal operation. The book *Machine Shop Practice* [Industrial Press Inc., New York, N.Y. (1981)] by Moltrecht presents at pages 199-204 a description, inter alia, of chip formation, as well as different kinds of chips (i.e., continuous chip, discontinuous chip, segmental chip). Moltrecht reads [in part] at pages 199-200, "When the cutting tool first makes contact with the metal, it compresses the metal ahead of the cutting edge. As the tool advances, the metal ahead of the cutting edge is stressed to the point where it will shear internally, causing the grains of the metal to deform and to flow plastically along a plane called the shear plane . . . . When the type of metal being cut is ductile, such as steel, the chip will come off in a continuous ribbon . . . ". Moltrecht goes on to describe formation of a discontinuous chip and a segmented chip. As another example, the text found at pages 302-315 of the *ASTE Tool Engineers Handbook*, McGraw Hill Book Co., New York, N.Y. (1949) provides a lengthy description of chip formation in the metal cutting process. At page 303, the ASTE Handbook makes the clear connection between chip formation and machining operations such as turning, milling and drilling. The following patent documents discuss the formation of chips in a material removal operation: U.S. Pat. No. 5,709,907 to Battaglia et al. (assigned to Kennametal Inc.), U.S. Pat. No. 5,722,803 to Battaglia et al. (assigned to Kennametal Inc.), and U.S. Pat. No. 6,161,990 to Oles et al. (assigned to Kennametal Inc.).

Coated cutting insert 20 comprises a substrate 22. A portion of the coating of coated cutting insert 20 is removed so as to show substrate 22 in FIG. 1. The substrate 22 can be made from any one of a number of acceptable substrate materials. Coated cutting insert 20 has a flank surface 24 and a rake surface 26. The flank surface 24 and the rake surface 26 intersect to form a cutting edge 28 at the juncture thereof. There is a coating scheme 30 on the surface of the substrate 22. It should be appreciated that the coated cutting insert may exhibit geometries that are different from the geometry shown in FIG. 1

The substrate for each one of the specific embodiments can be selected from the same group of materials. In this regard, suitable materials for the substrate include, but are not limited to, cemented carbides (e.g., but not limited to, tungsten carbide-cobalt materials), ceramics (e.g., but not limited to, silicon nitride-based ceramics, SiAlON-based ceramics, titanium carbonitride-based ceramics, titanium diboride-based ceramics), cermets (e.g., but not limited to, cermets that have nickel-cobalt binder and a high level of titanium and could further include tungsten carbide and titanium carbide), and steels.

Applicants also contemplate that the substrate could exhibit gradient compositions, especially in the binder concentration, the carbonitride concentration and the carbide concentration. Exemplary substrates could include a cemented carbide substrate that presents a surface zone of binder enrichment or a cemented carbide substrate that exhibits a surface zone of binder depletion of solid solution carbide enrichment.

Other exemplary substrate materials are polycrystalline cubic boron nitride (PCBN) (exemplary PCBN materials include those with ceramic or metallic binder) and other superhard materials. The PCBN materials can be used in conjunction with cutting inserts in two basic ways. For one way, the PCBN inserts may be brazed to the cutting insert body. For the second way, the PCBN cutting inserts may be full top inserts.

It should be appreciated that applicants contemplate that prior to the deposition of the coating scheme the surface of the substrate may be treated so as to improve the adhesion of the coating scheme to the substrate. Exemplary pre-treatments include a process to remove or reduce the level of binder at the surface of the substrate. In the case of the cobalt cemented tungsten carbide substrate such a pre-treatment would remove cobalt from the surface of the substrate or treat the surface to improve the coating adhesion. Another exemplary pre-treatment would be a process that mechanically works the surface of the substrate so as to roughen the surface of the substrate making it ready to produce good coating adhesion.

It should be appreciated that applicants contemplate that in some instances the surface of the coating scheme may be subjected to a post-deposition treatment so as to improve performance and/or smoothness and/or adhesion. One exemplary treatment is the removal of asperities from the surface of the coating scheme so as to reduce or minimize any stress riser sites. Another exemplary treatment is to preferentially remove the coating (or a part of the coating layer) from selected areas of the cutting insert. A surface treatment typically reduces the tensile stresses or increases the compressive stresses in the coating layer(s). For example, PCT Patent Publication No. WO 02/077312 to Widia GmbH discloses shot blasting a coating (PVD or PCVD or CVD) to increase internal pressure stress or reduce internal tension stress in the outer coating layers.

Furthermore, it should be appreciated that to improve adhesion of the coating layers there may be provided microscopically rough interfaces between each of the coating layers. These microscopically rough interfaces can be generated by controlling the CVD (or moderate temperature chemical vapor deposition [MT-CVD]) parameters so as to promote high growth rates for the coating layers. High growth rates in CVD (including MT-CVD processes) processes may occur by the use of relatively high deposition temperatures and/or relatively high pressures. As another alternative to improve adhesion between coating layers, applicants contemplate that in the deposition process the composition can be gradually changed between adjacent layers so as to reduce the existence of a sharp compositional interface between adjacent coating layers.

In regard to the process to produce each one of the specific embodiments, it should be appreciated that for each one of the process steps, the pressure and the duration of the process step can vary so as to achieve the desired coating thickness.

Figure 2:
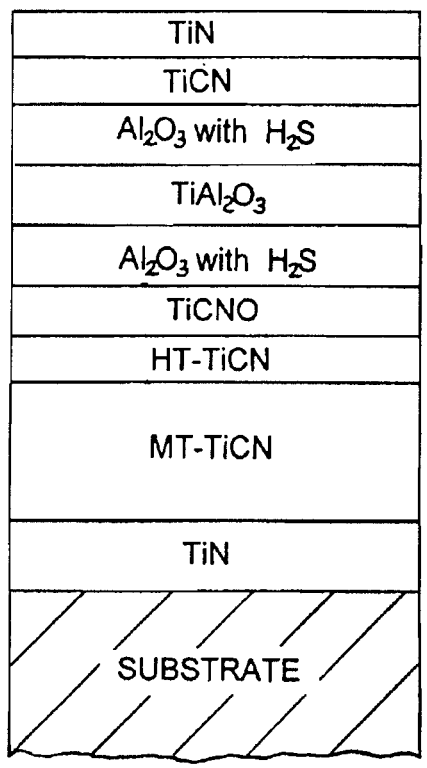
FIG. 2 is a schematic cross-sectional view of the specific coating scheme that comprises the specific example of cutting insert R1 in Table 5.

Referring to the coating scheme illustrated in FIG. 2, which is the coating scheme for the specific Example R1 cutting insert used in the cutting tests, the results of which are set forth in Table 5—Test Results for Examples R1 through R4. There is shown a substrate that is a cemented (cobalt) tungsten carbide of the following composition: about 93 weight percent tungsten carbide and about 7 weight percent cobalt. The coating scheme includes a backing coating scheme that comprises a base coating layer of titanium nitride applied to the surface of the substrate. On the surface of the base coating layer of titanium nitride, there is deposited by a CVD technique a moderate temperature CVD (MT-CVD) titanium carbonitride coating layer. On the surface of the MT-CVD titanium carbonitride coating layer there is deposited by a CVD technique a titanium carbonitride coating layer (deposited at a higher temperature, e.g., about 950° C. to about 1000° C.) and which can be characterized as a HT-TiCN coating layer. On the surface of the HT-titanium carbonitride coating layer there is deposited by a CVD technique a titanium oxycarbonitride (or TiCNO coating layer) coating layer. The process parameters used to deposit these coatings layer of the backing coating scheme are set forth in Table 1—Processing Parameters for the Backing Coating Scheme wherein Table 1 sets forth ranges for the temperature (° C.), the pressure (torr), and the duration of the deposition of the coating layer (minutes). The gaseous components of the gaseous mixture are set forth in volume percent.

TABLE 1

Processing Parameters for the Backing Coating Layers

| Coating layer | Temp. (° C.) | Pressure (Torr) | Duration (min) | $H_2$ (%) | $N_2$ (%) | $TiCl_4$ (%) | CO (%) | $CH_3CN$ (%) | HCl (%) | $CH_4$ (%) |
|---|---|---|---|---|---|---|---|---|---|---|
| TiN | 900~950° C. | 100~150 | 20~100 | 80 | 19 | 1 | — | — | — | — |
| MT-TiCN | 800~850° C. | 30~100 | 300~600 | 70 | 27.12 | 1.3 | — | 0.001 | 1.5 | — |
| HT-TiCN | 950~1000° C. | 100~150 | 30~150 | 78.8 | 16.7 | 0.8 | — | — | — | 3.7 |
| TiOCN | 950~1000° C. | 200~500 | 10~100 | 77.5 | 17.7 | 1.1 | 1.1 | — | — | 2.6 |

Table 1A below sets forth the specific temperature (° C.), the pressure (torr), and the duration of the deposition of the coating layer (minutes).

TABLE 1A

Processing Parameters for the Backing Coating Layers

| Coating Layer | Temp. (° C.) | Pressure (torr) | Duration (minutes) |
|---|---|---|---|
| TiN | 900° C. | 120 torr | 50 min. |
| MT-TiCN | 890° C. | 76, 40 torr* | 350 min. |
| HT-TiCN | 985° C. | 120 torr | 60 min. |
| TiOCN | 985° C. | 380 torr | 30 min. |

*The MT-TiCN coating layer is deposited in two steps wherein one step is at 40 torr and the other step is at 40 torr.

Referring to Table 1, and Table 1A to the extent applicable, the column entitled "Coating Layer" refers to the specific coating layer of the backing coating scheme, the column entitled "Temp." refers to the deposition temperature in degrees centigrade for the coating layer, the column entitled "Pressure" refers to the deposition pressure in torr, the column entitled "Duration" refers to the duration in minutes of the deposition of the coating layer, the next six columns refer to the specific gases that comprise the gaseous components of each step used to deposit the specific coating layer. The gas content is set forth in volume percent of the gaseous mixture.

Referring back to the coating scheme of FIG. 2, after completion of the deposition of the backing coating scheme, the next coating layer is of $Al_2O_3$ deposited using hydrogen sulfide ($H_2S$) in the deposition process on the surface of the TiCNO coating layer. The processing parameters used to deposit the $Al_2O_3$ with $H_2S$ coating layer are set forth in Table 2—Processing Parameters for the $Al_2O_3$ Coating Layer Using $H_2S$ wherein Table 2 sets forth ranges for the temperature (° C.), the pressure (torr), and the duration of the deposition of the coating layer (minutes). The gaseous components of the gaseous mixtures are set forth in volume percent.

TABLE 2

Processing Parameters for the Al$_2$O$_3$ Coating Layer Using H$_2$S

| Coating layer | Temp. (° C.) | Pressure (Torr) | Duration (min) | AlCl$_s$ (%) | H$_2$ (%) | CO$_2$ (%) | HCl (%) | H$_2$S (%) |
|---|---|---|---|---|---|---|---|---|
| Al$_2$O$_3$ | 950~1050° C. | 50~100 | 60~300 | 1.8 | 91.2 | 3.2 | 3.5 | 0.3 |

Table 2A below sets forth the specific temperature (° C.), the pressure (torr), and the duration of the deposition of the coating layer (minutes).

TABLE 2A

Processing Parameters for the Al$_2$O$_3$ Coating Layer Using H$_2$S

| Coating Layer | Temp. (° C.) | Pressure (torr) | Duration (minutes) |
|---|---|---|---|
| Al$_2$O$_3$ | 985° C. | 60 torr | 120 min |

Referring to Table 2, and to Table 2A to the extent applicable, the column entitled "Coating Layer" refers to the Al$_2$O$_3$ with H$_2$S coating layer, the column entitled "Temp." refers to the deposition temperature in degrees centigrade for the coating layer, the column entitled "Pressure" refers to the deposition pressure in torr, the column entitled "Duration" refers to the duration in minutes of the deposition of the coating layer, the next five columns refer to the specific gases that comprise the gaseous components used to deposit the specific Al$_2$O$_3$ with H$_2$S coating layer. The gaseous components of the gaseous mixtures are set forth in volume percent.

The next coating layer is a TiAl$_2$O$_3$ coating layer deposited on the surface of the Al$_2$O$_3$ with H$_2$S coating layer, and the processing parameters used to deposit the TiAl$_2$O$_3$ coating layer are set forth in Table 4—Processing Parameters for the TiAl$_2$O$_3$ Coating Layer. Referring to Table 4, the column entitled "Coating Layer" refers to the TiAl$_2$O$_3$ coating layer, the column entitled "Temp." refers to the deposition temperature in degrees centigrade for the coating layer, the column entitled "Pressure" refers to the deposition pressure in torr, the column entitled "Duration" refers to the duration in minutes of the deposition of the coating layer, the next five columns refer to the specific gases that comprise the gaseous components used to deposit the specific TiAl$_2$O$_3$ coating layer. The gaseous components of the gaseous mixtures are set forth in volume percent.

TABLE 4

Processing Parameters for the TiAl$_2$O$_3$ Coating Layer

| Coating layer | Temp. (° C.) | Pressure (Torr) | Duration (min) | AlCl$_s$ (%) | H$_2$ (%) | CO$_2$ (%) | HCl (%) | TiCl$_4$ (%) |
|---|---|---|---|---|---|---|---|---|
| TiAl$_2$O$_3$ | 950~1050° C. | 50~100 | 60~300 | 1.8 | 91.5 | 3.2 | 3.42 | 0.08 |

Table 4 sets forth ranges for the temperature (° C.), the pressure (torr), and the duration of the deposition of the coating layer (minutes). Table 4A below sets forth the specific temperature (° C.), the pressure (torr), and the duration of the deposition of the coating layer (minutes).

TABLE 4A

Processing Parameters for the TiAl$_2$O$_3$ Coating Layer

| Coating Layer | Temp. (° C.) | Pressure (torr) | Duration (minutes) |
|---|---|---|---|
| TiAl$_2$O$_3$ | 985° C. | 60 torr | 120 min. |

Although a specific volume percent is set forth in Table 4, the content of the TiCl$_4$ can vary (see Table 7), as can be seen from the processing conditions, to result in different concentrations of titanium in the TiAl$_2$O$_3$ coating layer. This can include the introduction of TiCl$_4$ in a gradient manner so that the titanium concentration in the TiAl$_2$O$_3$ coating layer can exhibit a concentration gradient throughout the TiAl$_2$O$_3$ coating layer. Even though the specific process parameters do not use H$_2$S to deposit the TiAl$_2$O$_3$ coating layer, there is the expectation that H$_2$S could be used, and especially in lower flow rates such as, for example, less than about 20 percent of the conventional usage to deposit an Al$_2$O$_3$ coating layer.

There should be an appreciation that the step of depositing by chemical vapor deposition the TiAl$_2$O$_3$ coating layer can use a gaseous composition comprising about 0.5 to about 2.5 volume percent AlCl$_3$, about 82.5 to about 98 volume percent H$_2$, about 0.01 to about 2.0 volume percent TiCl$_4$, about 0.5 to about 5.0 volume percent CO$_2$ and about 0.2 to about 8.0 volume percent HCl.

The next coating layer is a Al$_2$O$_3$ with H$_2$S coating layer deposited on the surface of the TiAl$_2$O$_3$ coating layer. This Al$_2$O$_3$ with H$_2$S coating layer is deposited using the same processing parameters as set forth in Table 2 (and Table 2A)

The top two coatings layers are a TiCN coating layer deposited on the surface of the Al$_2$O$_3$ with H$_2$S coating layer and a TiN coating layer deposited on the surface of the TiCN coating layer. The processing parameters for the TiCN layer are like those for the HT-TiCN coating layer in Table 1 (and Table 1A) and the processing parameters for the TiN are like those for the TiN coating layer in Table 1 (and Table 1A).

Figure 12:
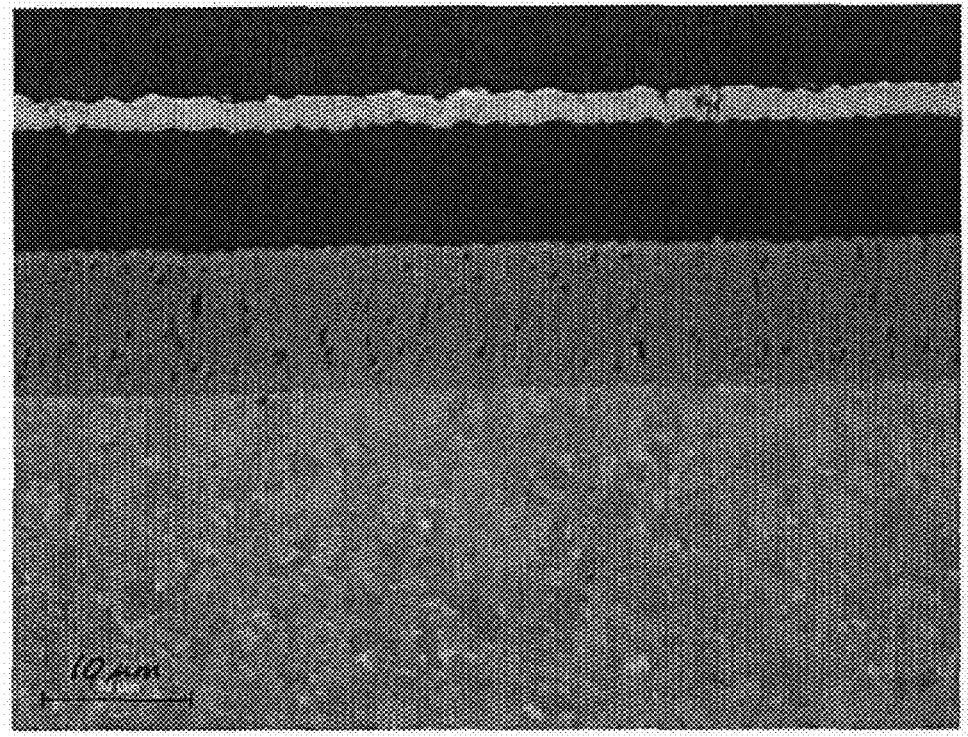
FIG. 12 is a photomicrograph (having a scale of 10 micrometers) of a cross-section of the rake face that is representative for cutting insert examples R1 through R4.
Figure 13:
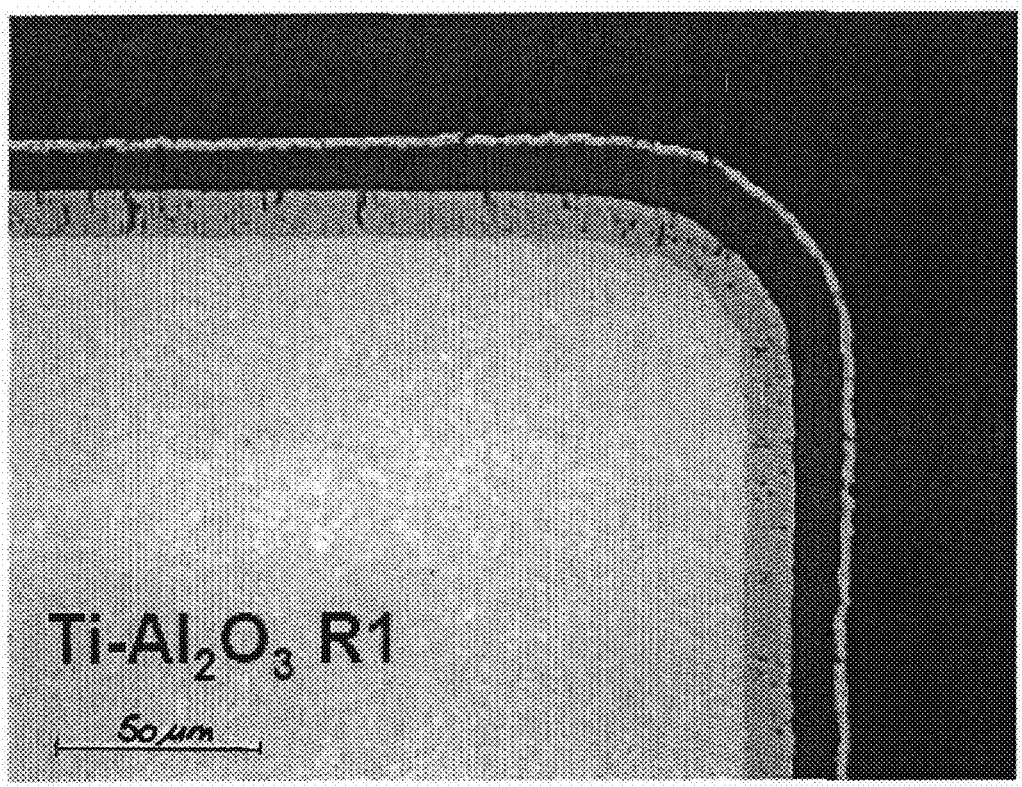
FIG. 13 is a photomicrograph (having a scale of 50 micrometers) of a cross-section of the corner for the cutting insert Example R1.

FIG. 12 is a photomicrograph (having a scale of 10 micrometers) of a cross-section of the rake face that is typical for cutting insert examples R1 through R4. FIG. 13 is a photomicrograph (having a scale of 50 micrometers) of a cross-section of the corner for the cutting insert Example R1.

Figure 3:
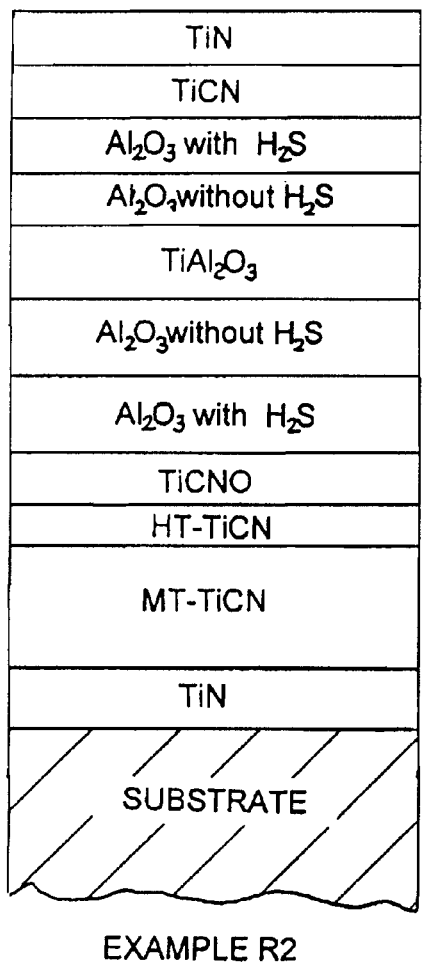
FIG. 3 is a schematic cross-sectional view of the specific coating scheme that comprises the specific example of cutting insert R2 in Table 5.

Referring to the coating scheme illustrated in FIG. 3, which is the coating scheme for the specific Example R2 cutting insert used in the cutting tests, the results of which are set forth in Table 5—Test Results for Examples R1 through R4. There is shown a substrate that is a cemented (cobalt) tungsten carbide of the following composition: about 93 weight percent tungsten carbide and about 7 weight percent cobalt. The coating scheme includes a backing coating scheme that comprises a base coating layer of titanium nitride applied to the surface of the substrate. On the surface of the base coating layer of titanium nitride, there is deposited by a CVD technique a moderate temperature CVD (MT-CVD) titanium carbonitride coating layer. On the surface of the MT-CVD titanium carbonitride coating layer there is deposited by a CVD technique a titanium carbonitride coating layer (deposited at a higher temperature, e.g., 950-1000° C.) and which can be characterized as a HT-TiCN coating layer. On the surface of the HT-titanium carbonitride coating layer there is deposited by a CVD technique a titanium oxycarbonitride (or TiCNO coating layer) coating layer. The process parameters used to deposit these coatings layer of the backing coating scheme are set forth in Table 1 and Table 1A.

The next coating layer is a $Al_2O_3$ with $H_2S$ coating layer deposited on the surface of the TiCNO coating layer using the Parameters as set forth in Table 2 and Table 2A. The next coating layer is an $Al_2O_3$ without $H_2S$ coating layer deposited on the surface of the $Al_2O_3$ with $H_2S$ coating layer using the processing parameters as se forth in Table 3—Processing Parameters for the $Al_2O_3$ Coating Layer not Using $H_2S$. Referring to Table 3, the column entitled "Coating Layer" refers to the $Al_2O_3$ without $H_2S$ coating layer, the column entitled "Temp." refers to the deposition temperature in degrees centigrade for the coating layer, the column entitled "Pressure" refers to the deposition pressure in torr, the column entitled "Duration" refers to the duration in minutes of the deposition of the coating layer, the next four columns refer to the specific gases that comprise the gaseous components used to deposit the specific $Al_2O_3$ without $H_2S$ coating layer. The gaseous components of the gaseous mixtures are set forth in volume percent.

according to the process parameters in Table 3. An $Al_2O_3$ with $H_2S$ coating layer is deposited on the surface of the $Al_2O_3$ without $H_2S$ coating layer using the process parameters in Table 2.

The top two coatings layers are a TiCN coating layer deposited on the surface of the $Al_2O_3$ with $H_2S$ coating layer and a TiN coating layer deposited on the surface of the TiCN coating layer. The processing parameters for the TiCN layer are like those for the HT-TiCN coating layer in Table 1 (and Table 1A) and the processing parameters for the TiN are like those for the TiN coating layer in Table 1 (and Table 1A). The thin TiN-top layer is deposited for wear indication and optical appearance. Further the TiN top layer can also function as sacrifice layer for post-coat wet-blasting to modify the stress situation in the coating layers.

Figure 4:
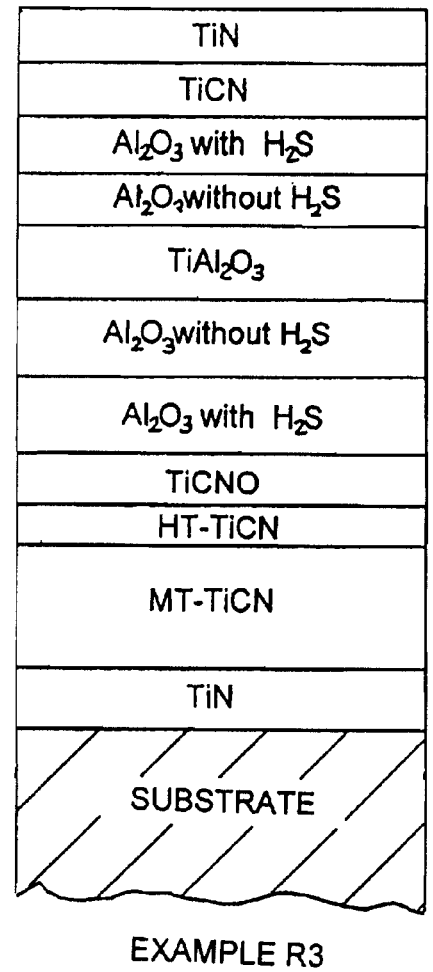
FIG. 4 is a schematic cross-sectional view of the specific coating scheme that comprises the specific example of cutting insert R3 in Table 5.

Referring to the coating scheme illustrated in FIG. 4, which is the coating scheme for the specific Example R3 cutting insert used in the cutting tests, the results of which are set forth in Table 5—Test Results for Examples R1 through R4. There is shown a substrate that is a cemented (cobalt) tungsten carbide of the following composition: about 93 weight percent tungsten carbide and about 7 weight percent cobalt. The coating scheme for the Example R3 is like that for the Example R2, except for the introduction of the TiCl4 during the deposition of the $TiAl_2O_3$ coating layer. See Table 7.

Figure 5:
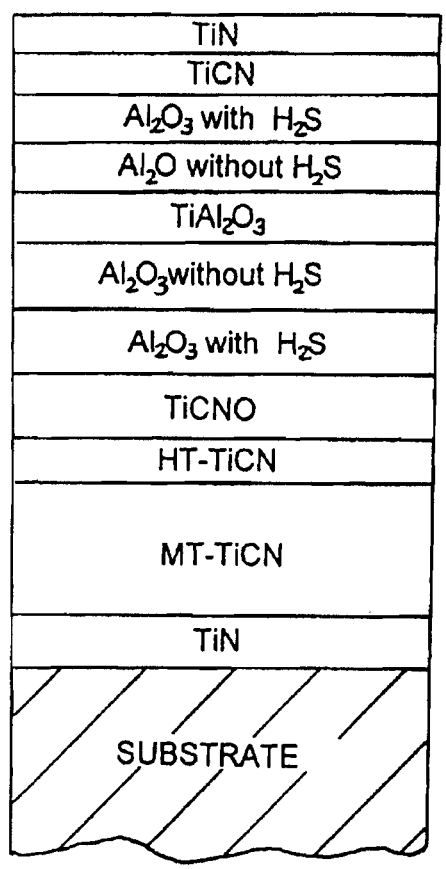
FIG. 5 is a schematic cross-sectional view of the specific coating scheme that comprises the specific example of cutting insert R4 in Table 5.
Figure 14:
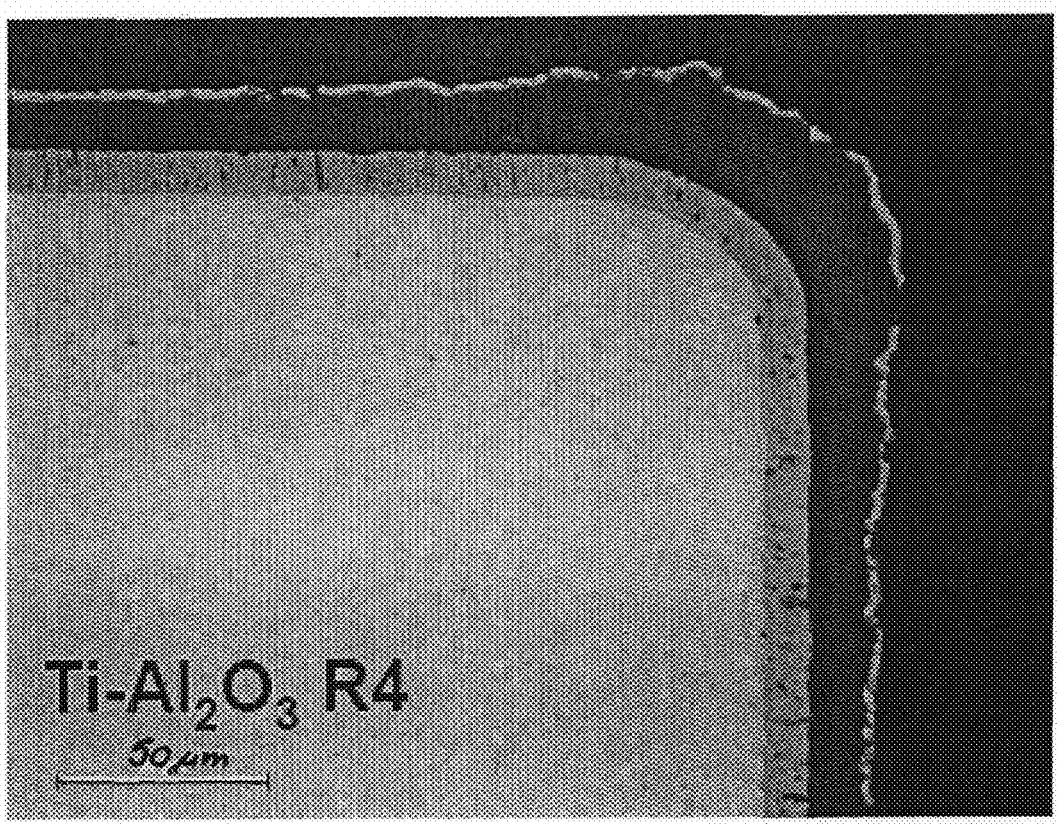
FIG. 14 is a photomicrograph (having a scale of 50 micrometers) of a cross-section of the corner for the cutting insert Example R4.

Referring to the coating scheme illustrated in FIG. 5, which is the coating scheme for the specific Example R4 cutting insert used in the cutting tests, the results of which are set forth in Table 5—Test Results for Examples R1 through R4. There is shown a substrate that is a cemented (cobalt) tungsten carbide of the following composition: about 93 weight percent tungsten carbide and about 7 weight percent cobalt. The coating scheme for the Example R4 is like that for the Example R2, except for the introduction of the TiCl4 during the deposition of the $TiAl_2O_3$ coating layer. See Table 7. FIG. 14 is a photomicrograph (having a scale of 50 micrometers) of a cross-section of the corner for the cutting insert Example R4.

TABLE 3

Processing Parameters for the $Al_2O_3$ Coating Layer Not Using $H_2S$

| Coating layer | Temp. (° C.) | Pressure (Torr) | Duration (min) | $AlCl_s$ (%) | $H_2$ (%) | $CO_2$ (%) | HCl (%) |
|---|---|---|---|---|---|---|---|
| $Al_2O_3$ | 950~1050° C. | 50~100 | 10~60 | 1.8 | 91.5 | 3.2 | 3.5 |

Table 3 sets forth ranges for the temperature (° C.), the pressure (torr), and the duration of the deposition of the coating layer (minutes). Table 3A below sets forth the specific temperature (° C.), the pressure (torr), and the duration of the deposition of the coating layer (minutes).

TABLE 3A

Processing Parameters for the $Al_2O_3$ Coating Layer not Using $H_2S$

| Coating Layer | Temp. (° C.) | Pressure (torr) | Duration (minutes) |
|---|---|---|---|
| $Al_2O_3$ | 985° C. | 60 torr | 30 min. |

The next coating layer is a $TiAl_2O_3$ coating layer deposited on the surface of the $Al_2O_3$ without $H_2S$ coating layer. The process parameters to deposit the $TiAl_2O_3$ coating layer are set forth in Table 4 and Table 4A.

The next coating layer is a $Al_2O_3$ without $H_2S$ coating layer deposited on the surface of the $TiAl_2O_3$ coating layer Table 5 sets forth the test results for metal cutting tests of Examples R1

TABLE 5

Metalcutting Test Results for Examples R1 through R4
Test conditions:
1000 sfm/0.012 ipr/0.08 doc
304.8 m/min/0.3048 mm/0.08 mm doc
Continuous Turning Test/Lead Angle: ~5
Workpiece Material: 1045 Steel (C 45 DIN)

| NO. | Tool Materials. | Geometry | Mean Tool Life (min) | Relative Tool Life vs 1 |
|---|---|---|---|---|
| 1 | KCP25 | CNMG432 RN | 12.0 | |
| 2 | $TiAl_2O_3$ R1 PostCoat Treated | CNMG432 RN | 11.6 | 96% |
| 3 | $TiAl_2O_3$ R2 PostCoat Treated | CNMG432 RN | 17.6 | 146% |
| 4 | $TiAl_2O_3$ R2 NO PostCoat | CNMG432 RN | 15.0 | 125% |
| 5 | $TiAl_2O_3$ R3 PostCoat Treated | CNMG432 RN | 13.8 | 115% |

TABLE 5-continued

Metalcutting Test Results for Examples R1 through R4
Test conditions:
1000 sfm/0.012 ipr/0.08 doc
304.8 m/min/0.3048 mm/0.08 mm doc
Continuous Turning Test/Lead Angle: ~5
Workpiece Material: 1045 Steel (C 45 DIN)

Figure 15:
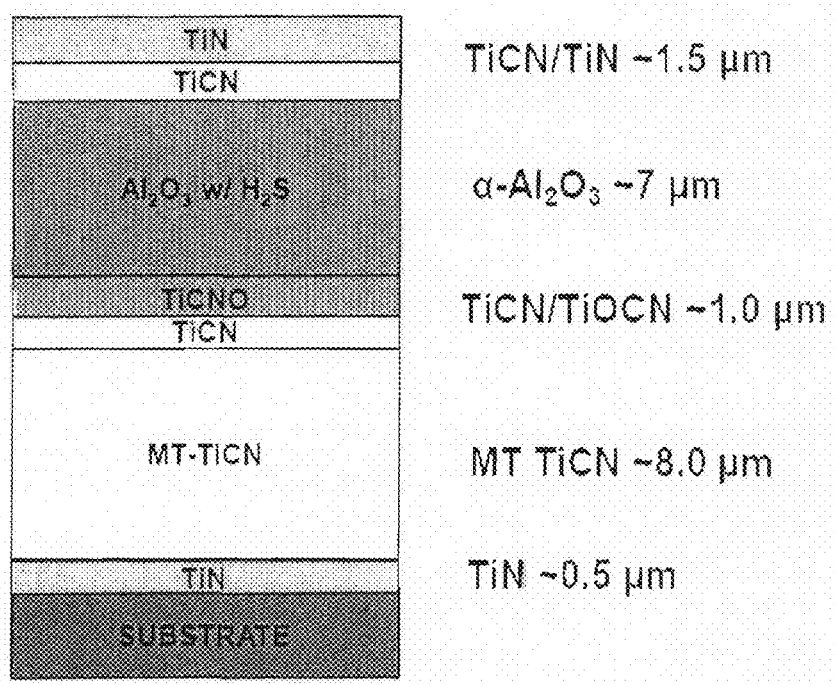
FIG. 15 is a schematic cross-sectional view of the specific coating scheme that comprises the coating scheme of the KCP25 cutting insert used in the testing for Table 5.

| NO. | Tool Materials. | Geometry | Mean Tool Life (min) | Relative Tool Life vs 1 |
|---|---|---|---|---|
| 6 | TiAl$_2$O$_3$ R4 PostCoat Treated | CNMG432 RN | 15.8 | 132% |
| 7 | TiAl$_2$O$_3$ R4 NO PostCoat | CNMG432 RN | 16.6 | 138% | through R4 as compared against the KCP25 cutting insert. FIG. 15 describes the coating scheme of the KCP25 cutting insert used in the testing. The designation "NO Post Coat" means that the coated cutting insert was not subjected to a post-coating treatment. The designation "Post Coat Treated" means that the coated cutting insert was subjected to wet blasting with alumina grit after deposition of the coating scheme.

As is apparent from the test results, the Examples R2 through R4 exhibit improved tool life over the KCP25 cutting insert, which used the coating scheme as set forth in FIG. 15.

The thickness (in micrometers) for the Examples R1 through R4 are set

TABLE 6

Thickness (micrometers) of Coating Layers for Examples R1 through R4

| Coating Layers | Thickness (μm) | | | |
|---|---|---|---|---|
| | TiAl$_2$O$_3$R1 | TiAl$_2$O$_3$R2 | TiAl$_2$O$_3$R3 | TiAl$_2$O$_3$R4 |
| TiN | 0.6 | 0.7 | 0.5 | 0.5 |
| MT-TiCN | 10 | 9.0 | 9.6 | 9.2 |
| HT-TiCN | 0.9 | 1.3 | 0.9 | 0.8 |
| Al$_2$O$_3$/TiAl$_2$O$_3$/Al$_2$O$_3$ | 7.7 | 7.3 | 11.2 | 8.8 |
| TiCN/TiN | 2 | 2.6 | 2.5 | 2.3 |
| Total | 20.2 | 20.9 | 24.7 | 21.7 | forth in Table 6 above. In reference to the thickness, the column identified as Al$_2$O$_3$/TiAl$_2$O$_3$/Al$_2$O$_3$ represents the total thickness (sum of the thicknesses) of the Al$_2$O$_3$ coating layers and the Ti Al$_2$O$_3$ coating layer.

It can therefore be appreciated that the coating scheme can have the following thickness parameters. The base titanium nitride coating layer has a thickness equal to between about 0.5 μm and about 0.7 μm. The MT-titanium carbonitride coating layer has a thickness equal to between about 9.2 μm and about 10 μm. The HT-titanium carbonitride coating layer has a thickness equal to between about 0.8 μm and about 1.3 μm. The thicknesses of the inner aluminum oxide coating layer deposited by chemical vapor deposition using hydrogen sulfide and the outer aluminum coating layer deposited by chemical vapor deposition using hydrogen sulfide and the TiAl$_2$O$_3$ coating layer added together is between about 7.3 μm and about 11.2 μm. The thickness of the exterior titanium-containing coating scheme is between about 2 μm and about 2.6 μm.

It can be further appreciated that the coating scheme can have the following thickness parameters. The base titanium nitride coating layer has a thickness equal to between about 0.05 μm and about 2.0 μm. The MT-titanium carbonitride coating layer has a thickness equal to between about 1.0 μm and about 25.0 μm. The HT-titanium carbonitride coating layer has a thickness equal to between about 0.05 μm and about 5.0 μm. The thickness of the inner aluminum oxide coating layer deposited by chemical vapor deposition using hydrogen sulfide and the TiAl$_2$O$_3$ coating layer added together is between about 0.5 μm and about 25.0 μm. The thickness of the exterior titanium carbonitride coating layer and the exterior titanium nitride layer added together is between about 0.5 μm and about 5.0 μm.

Referring to the coating schemes as set forth in FIGS. 6 through 9, the coating layers are self-explanatory. For each of the coating schemes of FIGS. 6-9, the backing coating scheme is deposited on the surface of the substrate. The backing coating scheme comprises a base coating layer of titanium nitride applied to the surface of the substrate. On the surface of the base coating layer of titanium nitride, there is deposited by a CVD technique a moderate temperature CVD (MT-CVD) titanium carbonitride coating layer. On the surface of the MT-CVD titanium carbonitride coating layer there is deposited by a CVD technique a titanium carbonitride coating layer (deposited at a higher temperature, e.g., 950-1000° C.) and which can be characterized as a HT-TiCN coating layer. On the surface of the HT-titanium carbonitride coating layer there is deposited by a CVD technique a titanium oxycarbonitride (or TiCNO coating layer) coating layer. The process parameters used to deposit these coatings layer of the backing coating scheme are set forth in Table 1—Processing Parameters for the Backing Coating Scheme.

Figure 6:
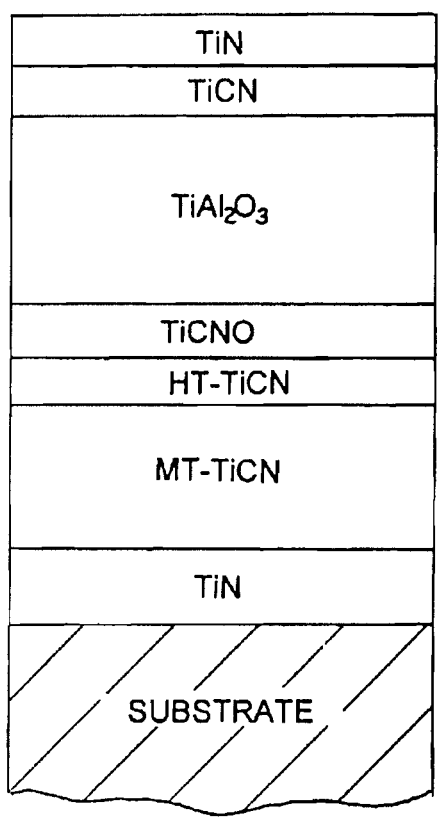
FIG. 6 is a schematic cross-sectional view of one specific embodiment of a coating scheme that would be useful to use with the coated cutting insert of FIG. 1.

For the coating scheme of FIG. 6, the TiAl$_2$O$_3$ coating layer is deposited on the surface of the TiCNO coating layer. The TiAl$_2$O$_3$ coating layer is typically deposited according to the process parameters of Table 4. The top two coatings layers are a TiCN coating layer deposited on the surface of the TiAl$_2$O$_3$ coating layer and a TiN coating layer deposited on the surface of the TiCN coating layer. The processing parameters for the TiCN layer are like those for the HT-TiCN coating layer in Table 1 and the processing parameters for the TiN are like those for the TiN coating layer in Table 1.

Figure 7:
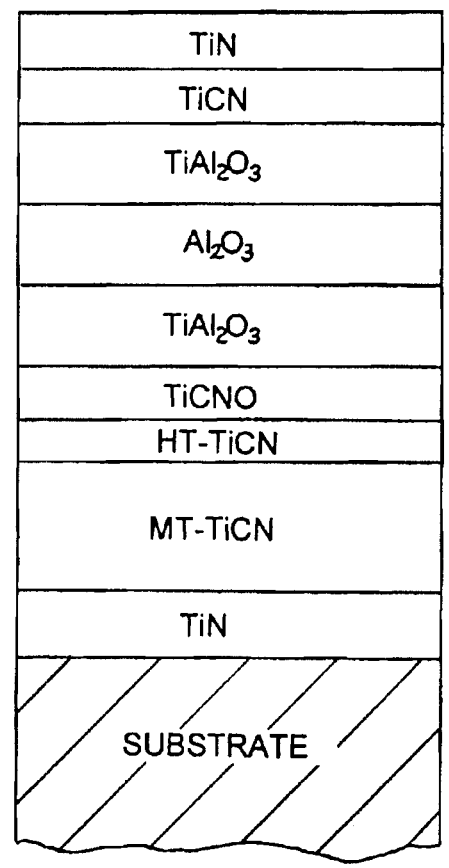
FIG. 7 is a schematic cross-sectional view of another specific embodiment of a coating scheme that would be suitable to use with the coated cutting insert of FIG. 1.

For the coating scheme of FIG. 7, the TiAl$_2$O$_3$ coating layer is deposited on the surface of the TiCNO coating layer. The TiAl$_2$O$_3$ coating layer is typically deposited according to the process parameters of Table 4. The Al$_2$O$_3$ coating layer is deposited on the surface of the TiAl$_2$O$_3$ coating layer. The specific process parameters are selected from those in Table 3 used to deposit the Al$_2$O$_3$ without H$_2$S coating layer and those process parameters in Table 2 to deposit the Al$_2$O$_3$ with H$_2$S coating layer. A TiAl$_2$O$_3$ coating layer is deposited on the surface of the Al$_2$O$_3$ coating layer. The TiAl$_2$O$_3$ coating layer is typically deposited according to the process parameters of Table 4. The top two coatings layers are a TiCN coating layer deposited on the surface of the TiAl$_2$O$_3$ coating layer and a TiN coating layer deposited on the surface of the TiCN coating layer. The processing parameters for the TiCN layer are like those for the HT-TiCN coating layer in Table 1 and the processing parameters for the TiN are like those for the TiN coating layer in Table 1.

There is the expectation that the use of the alternate coating layers of an Al$_2$O$_3$ coating layer and a TiAl$_2$O$_3$ coating layer can impact grain growth kinetics resulting in grain boundary, chemistry and interfacial structural differences as compared to a plurality of thin Al$_2$O$_3$ coating layers.

Further, there is the expectation that the grains may have different intragranular regions such as, for example, TiAl$_2$O$_3$ intragranular regions and $Al_2O_3$ intragranular regions. There can be a titanium concentration gradient in a grain from an intragranular region that has zero titanium to another intragranular region that has a maximum titanium content. There is also the expectation that there can be a titanium concentration gradient in a grain from an intragranular region that has zero titanium to another intragranular region that has a maximum titanium content and then still another intragranular region that has zero titanium. There is a suggestion that the grains (e.g., Ti $Al_2O_3$) can grow from early nucleation and keep growing until the $Al_2O_3$ region.

Figure 8:
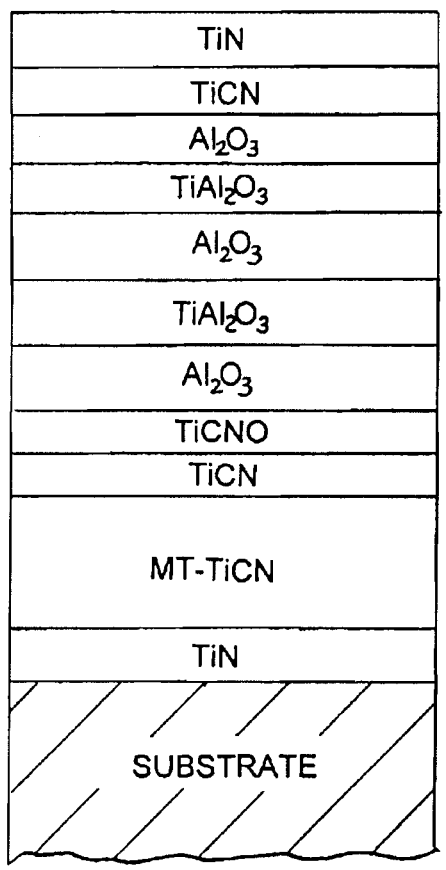
FIG. 8 is a schematic cross-sectional view of still another specific embodiment of a coating scheme that would be suitable to use with the coated cutting insert of FIG. 1.

For the coating scheme of FIG. 8, the $Al_2O_3$ coating layer is deposited on the surface of the TiCNO coating layer. The specific process parameters are selected from those in Table 3 used to deposit the $Al_2O_3$ without $H_2S$ coating layer and those process parameters in Table 2 to deposit the $Al_2O_3$ with $H_2S$ coating layer. A $TiAl_2O_3$ coating layer is deposited on the surface of the $Al_2O_3$ coating layer. The $TiAl_2O_3$ coating layer is typically deposited according to the process parameters of Table 4. An $Al_2O_3$ coating layer is deposited on the surface of the $TiAl_2O_3$ coating layer, and a $TiAl_2O_3$ coating layer is deposited on the surface of the $Al_2O_3$ coating layer, and still another $Al_2O_3$ coating layer is deposited on the surface of the $TiAl_2O_3$ coating layer. The top two coatings layers are a TiCN coating layer deposited on the surface of the $Al_2O_3$ coating layer and a TiN coating layer deposited on the surface of the TiCN coating layer. The processing parameters for the TiCN layer are like those for the HT-TiCN coating layer in Table 1 and the processing parameters for the TiN are like those for the TiN coating layer in Table 1.

Figure 9:
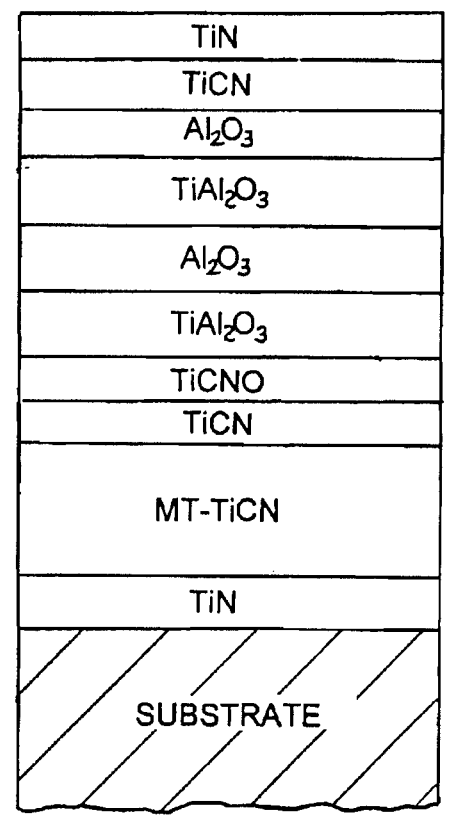
FIG. 9 is a schematic cross-sectional view of yet another specific embodiment of a coating scheme that would be suitable to use with the coated cutting insert of FIG. 1.

For the coating scheme of FIG. 9, the $TiAl_2O_3$ coating layer is deposited on the surface of the TiCNO coating layer. The $TiAl_2O_3$ coating layer is typically deposited according to the process parameters of Table 4. The $Al_2O_3$ coating layer is deposited on the surface of the $TiAl_2O_3$ coating layer. The specific process parameters are selected from those in Table 3 used to deposit the $Al_2O_3$ without $H_2S$ coating layer and those process parameters in Table 2 to deposit the $Al_2O_3$ with $H_2S$ coating layer. A $TiAl_2O_3$ coating layer is deposited on the surface of the $Al_2O_3$ coating layer. The $TiAl_2O_3$ coating layer is typically deposited according to the process parameters of Table 4. An $Al_2O_3$ coating layer is deposited on the surface of the $TiAl_2O_3$ coating layer. The top two coatings layers are a TiCN coating layer deposited on the surface of the $TiAl_2O_3$ coating layer and a TiN coating layer deposited on the surface of the TiCN coating layer. The processing parameters for the TiCN layer are like those for the HT-TiCN coating layer in Table 1 and the processing parameters for the TiN are like those for the TiN coating layer in Table 1.

There should be an appreciation that the above examples do not comprise all possible coating schemes that include the $TiAl_2O_3$ coating layer. The coating sequences can vary so that the $TiAl_2O_3$ coating layer is sandwiched between $Al_2O_3$ coating layers with an even additional variation including the $Al_2O_3$ with $H_2S$ coating layer and the $Al_2O_3$ without $H_2S$ coating layer.

Figure 10:
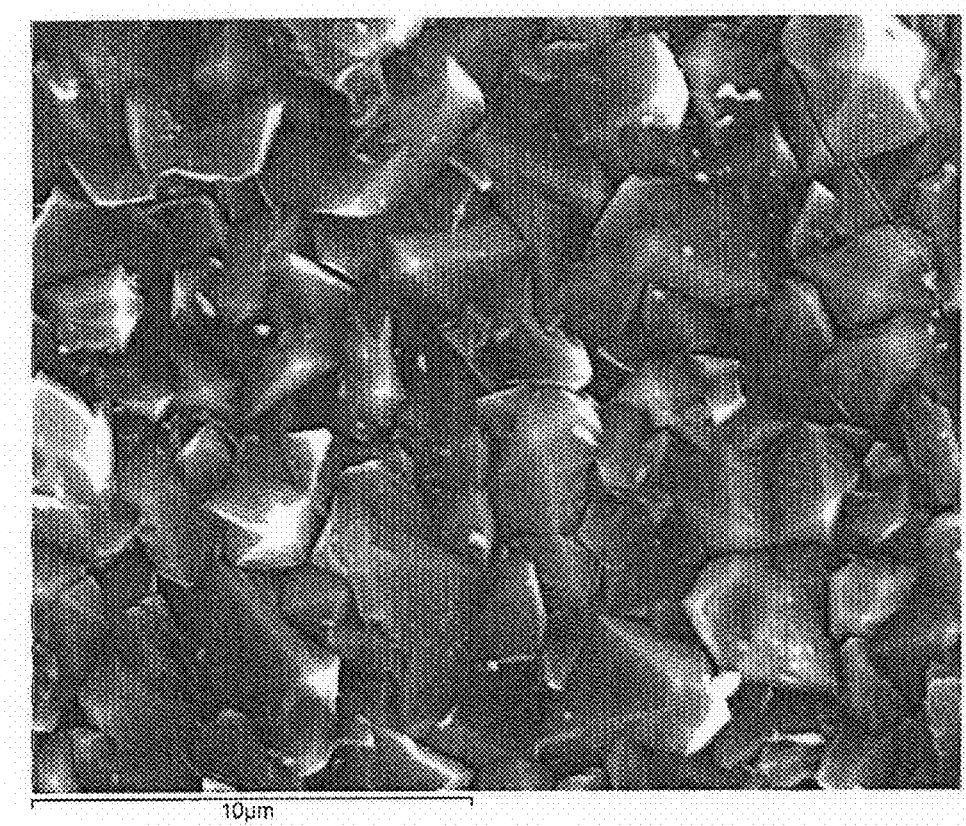
FIG. 10 is a photomicrograph (having a scale of 10 micrometers) of the surface of a CVD $Al_2O_3$ coating layer.
Figure 11:
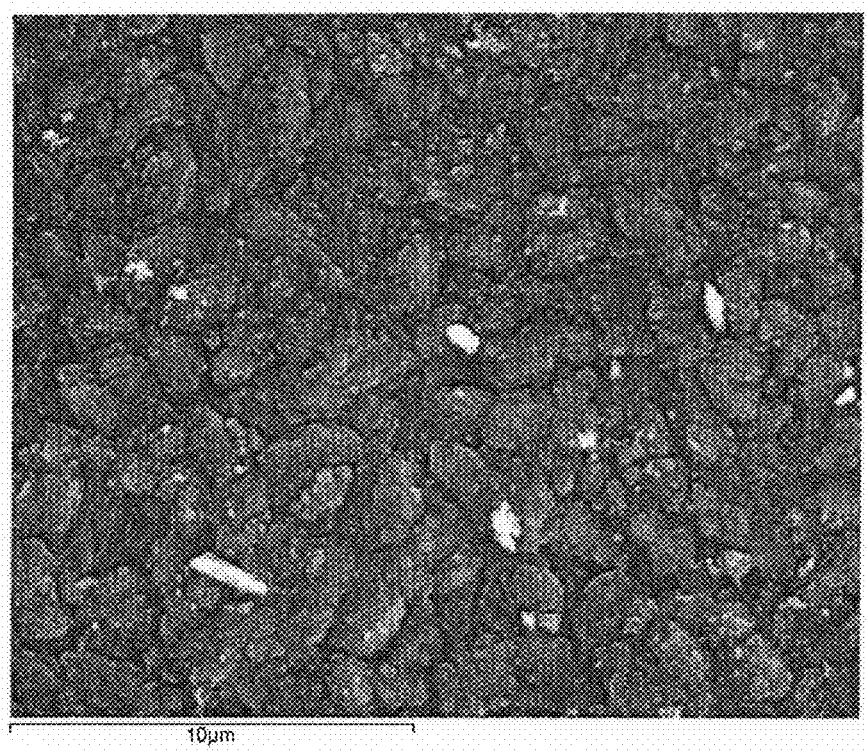
FIG. 11 is a photomicrograph (having a scale of 10 micrometers) of the surface of a CVD $TiAl_2O_3$ coating layer of Example R3.

FIGS. 10 and 11 compare the surface morphology of an $Al_2O_3$ coating layer and a $TiAl_2O_3$ coating layer, respectively. The grain morphology of the $TiAl_2O_3$ coating layer exhibits smaller grains and the larger grains are formed by the aggregated smaller, finer grains. The $Al_2O_3$ coating layer has sharper faceted grain structure.

Based upon SEM EDS analysis, the titanium content in the $TiAl_2O_3$ coating layers ranges between about 0.01 atomic percent and about 2 atomic percent.

In reference to the titanium content, in Examples R1 through R4 the content of $TiCl_4$ flow varies as shown by the Table 7 below.

TABLE 7

$TiCl_4$ Content in Gaseous Mixture

| Example | $TiCl_4$ Flow Percentage (vol %) |
|---|---|
| R1 | 0.08 |
| R2 | 0.08 |
| R3 | 0.12 |
| R4 | 0.16 |

The patents and other documents identified herein are hereby incorporated by reference herein. Other embodiments of the invention will be apparent to those skilled in the art from a consideration of the specification or a practice of the invention disclosed herein. It is intended that the specification and examples are illustrative only and are not intended to be limiting on the scope of the invention. The true scope and spirit of the invention is indicated by the following claims.

What is claimed is:

1. A method for making a coating cutting insert comprising the steps of:
   providing a substrate having a substrate surface;
   depositing by chemical vapor deposition a backing coating scheme on the substrate surface; and
   depositing by chemical vapor deposition a $TiAl_2O_3$ coating layer from a gaseous composition including $AlCl_3$, $H_2$, $TiCl_4$, $CO_2$ and HCl.

2. The method for making a coated cutting insert according to claim 1 wherein the step of depositing by chemical vapor deposition a $TiAl_2O_3$ coating layer occurs under the following parameters: a temperature between about 950° C. and about 1050° C., a pressure of between about 50 torr and about 100 torr, and a duration of between about 60 minutes and about 300 minutes.

3. The method for making a coated cutting insert according to claim 1 wherein the step of depositing by chemical vapor deposition a $TiAl_2O_3$ coating layer occurs under the following parameters: a temperature equal to about 985° C., a pressure equal to about 60 torr, and a duration equal to about 120 minutes.

4. The method for making a coated cutting insert according to claim 1 wherein the step of depositing by chemical vapor deposition a $TiAl_2O_3$ coating layer uses a gaseous composition comprising about 1.8 volume percent $AlCl_3$, about 91.5 volume percent $H_2$, about 0.08 volume percent $TiCl_4$, about 3.2 volume percent $CO_2$ and about 3.42 volume percent HCl.

5. The method for making a coated cutting insert according to claim 1 wherein the step of depositing by chemical vapor deposition a $TiAl_2O_3$ coating layer uses a gaseous composition comprising about 0.5 to about 2.5 volume percent $AlCl_3$, about 82.5 to about 98 volume percent $H_2$, about 0.01 to about 2.0 volume percent $TiCl_4$, about 0.5 to about 5.0 volume percent $CO_2$ and about 0.2 to about 8.0 volume percent HCl.

6. The method for making a coated cutting insert according to claim 1 further comprising a step of depositing on the $TiAl_2O_3$ coating layer by chemical vapor deposition an aluminum oxide coating layer.

7. The method for making a coated cutting insert according to claim 6 wherein the step of depositing on the $TiAl_2O_3$ coating layer by chemical vapor deposition an aluminum oxide coating layer uses hydrogen sulfide, and occurs under the following parameters: a temperature between about 950° C. and about 1050° C., a pressure of between about 50 torr and about 100 torr, and a duration of between about 60 minutes and about 300 minutes.

8. The method for making a coated cutting insert according to claim 6 wherein the step of depositing on the $TiAl_2O_3$ coating layer by chemical vapor deposition an aluminum oxide coating layer does not use hydrogen sulfide, and occurs under the following parameters: a temperature between about 950° C. and about 1050° C., a pressure of between about 50 torr and about 10 torr, and a duration of between about 10 minutes and about 60 minutes.

9. A method for making a coated cutting insert comprising the steps of:
   providing a substrate having a substrate surface;
   depositing by chemical vapor deposition a backing coating scheme on the substrate surface; and
   depositing by chemical vapor deposition a $TiAl_2O_3$-aluminum oxide coating scheme comprising alternating coating layers of a $TiAl_2O_3$ coating layer deposited using chemical vapor deposition from a gaseous composition including $AlCl_3$, $H_2$, $TiCl_4$, $CO_2$ and HCl and an aluminum oxide coating layer.

10. The method for making a coated cutting insert according to claim 9 wherein the aluminum oxide coating layer is deposited by chemical vapor deposition from a gaseous composition comprising $AlCl_3$, $H_2$, $CO_2$ and HCl and optionally $H_2S$.

\* \* \* \* \*